United States Patent [19]

Kinoshita et al.

[11] Patent Number: 4,684,183
[45] Date of Patent: Aug. 4, 1987

[54] CONNECTOR FOR FLEXIBLE PRINTED CIRCUIT

[75] Inventors: Toshio Kinoshita, Hino; Naoki Hiyama, Tokyo, both of Japan

[73] Assignee: E. I. Du Pont de Nemours and Company, Wilmington, Del.

[21] Appl. No.: 864,857

[22] Filed: May 20, 1986

[30] Foreign Application Priority Data

Sep. 6, 1985 [JP] Japan .................................. 60-197134

[51] Int. Cl.⁴ .............................................. H01R 9/07
[52] U.S. Cl. ...................................................... 439/77
[58] Field of Search .......... 339/17 F, 75 MP, 176 MF

[56] References Cited

U.S. PATENT DOCUMENTS

| | | | |
|---|---|---|---|
| 3,059,211 | 10/1962 | Thomas et al. | 339/17 F |
| 3,253,248 | 5/1966 | Brown | 339/17 F |
| 3,696,319 | 10/1972 | Olsson | 339/176 MF |
| 4,477,134 | 10/1984 | Wright | 339/17 F |

FOREIGN PATENT DOCUMENTS 1039037  8/1983  U.S.S.R. ....................... 339/176 MF

Primary Examiner—Neil Abrams

[57] ABSTRACT

An electrical connector includes elastic female contacts arranged in an insulating housing having opening, and a spring member obtained by V-bending an elastic sheet. A flexible printed circuit (FPC), which is attached to the V-bent outside surface of the spring member and having an exposed-conductor section to be electrically connected to a contact section of the female contact, is inserted with the spring member into the housing through the opening. The respective conductors of the FPC contact the corresponding female contacts under the spring elasticity of the spring member.

13 Claims, 12 Drawing Figures

CONNECTOR FOR FLEXIBLE PRINTED CIRCUIT

BACKGROUND OF THE INVENTION

Industrial Applicability

This invention relates to an electrical connector, and in particular a connector for FPC (flexible printed circuit).

Background Art

Various FPC connectors, such as ZIF (zero insertion force) connector and a connector using a soldering method are known in which an exposed-conductor portion of the forward end portion of an FPC is electrically connected to the contacts disposed within an insulating housing. In the soldering type connector, the conductors exposed at the forward end portion of the FPC are connected by soldering to the contacts in a one-to-one correspondence. In the ZIF connector, the exposed-conductor portion of the forward end portion of the FPC is inserted into the female contacts arranged within a housing, and then the FPC is connected by a suitable external force to the female contacts.

In the soldering type connector, however, the exposed-conductors of the FPC must be individually connected to the contacts, thus lowering an operability at the time of assembly. Furthermore, the FPC, once soldered, cannot be detached from the contact array. In the ZIF connector, the FPC can freely be attached to and detached from the female contact array, but two steps are necessary: once when the FPC is inserted into the female contact array and once when an external force is applied to that assembly. Furthermore, the external force will be not uniformly distributed over the contacts and the interconnection of the respective contacts will be defective.

SUMMARY OF THE INVENTION

One object of this invention is to provide an FPC connector which can ensure a positive electrical connection between an FPC and a female contact array and can readily attach and detach the FPC to and from the female contact array.

Another object of this invention is to provide an FPC connector which can guide an FPC into a female contact array and properly position it in the female contact array.

Another object of this invention is to provide an FPC connector which permits a ready insertion of an FPC into a female array as well as less wear of the FPC.

According to this invention there is provided a connector for flexible printed circuit comprising: an elongated insulating housing having an elongated opening through which a flexible printed circuit is inserted; an array of female contacts, arranged within the housing and extending in the lengthwise direction of the housing, the respective female contact having a fixed section fixed in the housing to a first side wall of said housing corresponding to one side of the elongated opening and a contact section connected to a base portion of the fixed section and formed along a second side wall of said housing facing the first side wall in a state parallel to the fixed section such that said contact section is urged toward the fixed section; a spring member made of a thin sheet V-bent to provide first and second sections and inserted into the housing through the openings with the V-bent side to be held between the fixed and contact sections of the female contact under an elastic force of the contact section of the female contact; and a flexible printed circuit attached to the V-bent outside surface of the spring member and having an exposed-conductor section to be electrically connected to the contact sections of the female contacts.

The female contacts and FPC are elastic in nature, because the female contacts have spring elasticity, and the FPC is formed integral with the elastic spring member and has spring elasticity. Therefore, the FPC is connected to the female contact array under its own spring elasticity, and a highly-reliable connection can be achieved by removably inserting the FPC into the female contacts in the array by a simple operation.

DETAILED DESCRIPTION OF THE PREFERRED EMBODIMENTS

An FPC connector according to one embodiment of this invention will be explained with reference to the accompanying drawings.

Figure 1A:
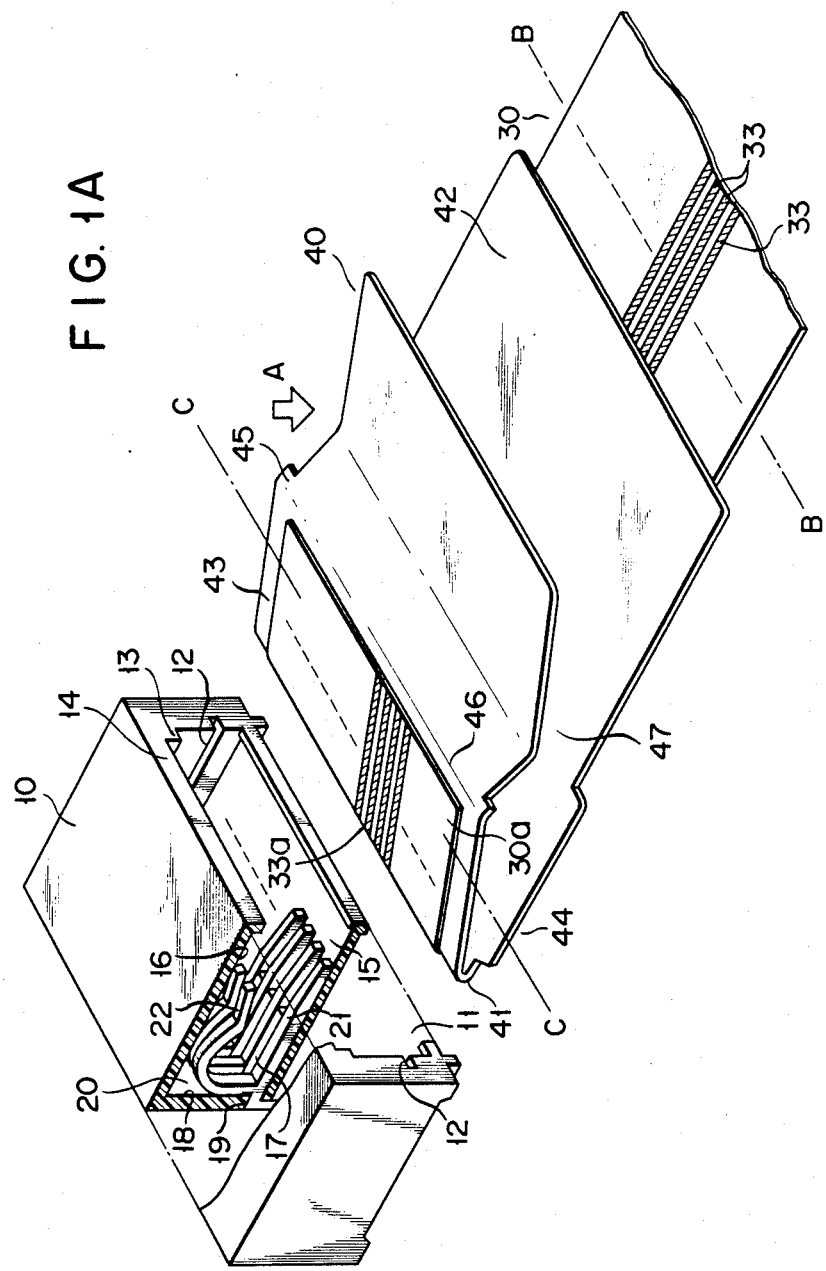
FIG. 1A is a perspective view, partly broken away, showing an FPC connector according to one embodiment of this invention.

Insulating housing 10 has elongaged opening 11. Female contacts 20 are disposed within housing 10 as shown in FIG. 1A. Each of the contacts 20 has a fixed section 21 extending at right angles to opening 11 and fixed to a first side wall 15 of the housing and a contact section 22 connected to the base end of the fixed section and formed along a second side wall 16 of said housing facing first side wall 15. FPC 30 is inserted through opening 11 into housing 10 and connected to female contacts 20 as will be described below.

Figure 1B:
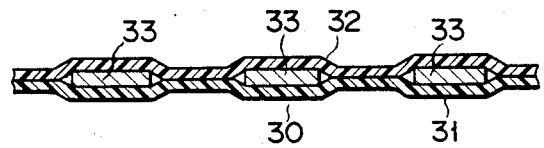
FIG. 1B is an enlarged, cross-sectional view showing a portion of the FPC connector as taken along line B—B in FIG. 1A.
Figure 1C:
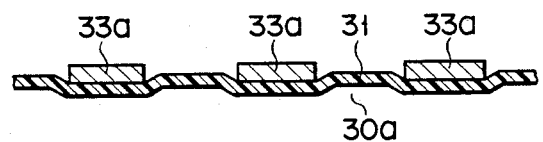
FIG. 1C is an enlarged, cross-sectional view showing a portion of the FPC connector as taken along line C—C in FIG. 1A.

FPC 30 is comprised of first insulating sheet 31, second insulating sheet 32 and parallel array of flat conductors 33 protected at both sides by first and second insulating sheets 31 and 32, as shown in FIG. 1B. A spacing between the respective conductors 33 is equal to a spacing between the respective contacts 20. Conductors 33 are exposed at forward end portion 30a as shown in FIGS. 1A and 1C so that they can electrically connect the female contacts. The forward end portion 30a of FPC 30 has the rear surface bonded to the outer surface of spring member 40.

Spring member 40 is formed from an elastic thin sheet of, for example, stainless steel or synthetic resin. It is made by bending the elastic sheet along first bent line 41, providing first and second sections 42 and 43. The spring member has extension section 47 extending from the second section 43. Extension section 47 is bent at an boundary of second section 43 along a second bent line 46 to said first section 42 and further bent in a direction parallel to second section 43, providing a step at the extension section.

If no compressive force is applied to V-bent spring member 40 in the direction of arrow A in FIG. 1A, spring member 40 is more widely open than the space between fixed section 21 and contact section 22 of contact 20. Thus, when spring member 40 is inserted into the female contact array it can be held between the fixed and contact sections of the female contact by the elastic force of the contact section of the female contact.

FPC 30 is bent along bent line 41, so that exposedconductor portion 33a appear outside, and is attached to the outer surface of spring member 40. FPC 30 is, therefore, formed integral with spring member 40 to have a spring elasticity.

Figure 2:
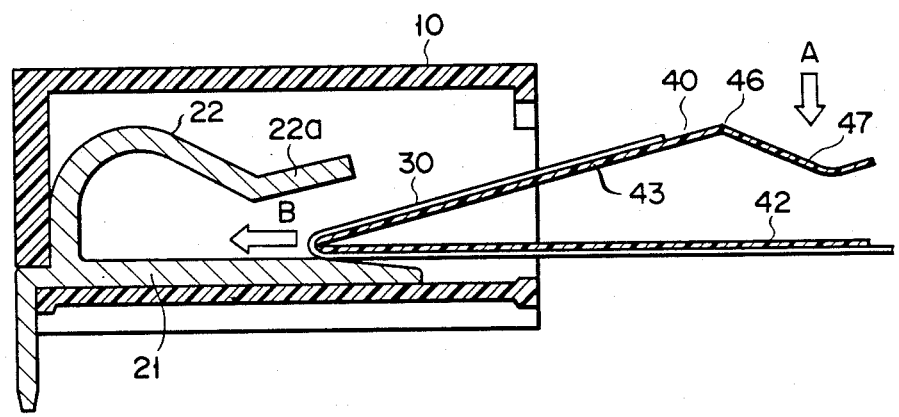
FIGS. 2 and 3A each are a cross-sectional view showing successive steps in insertion of the FPC into the housing of FIG. 1A.
Figure 3A:
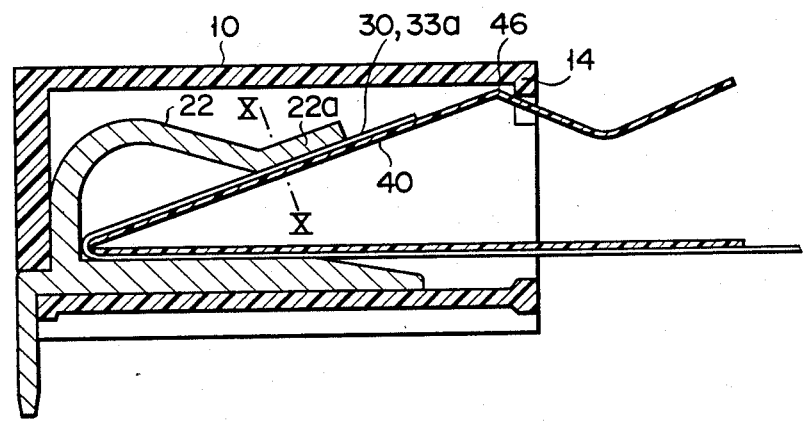

FIGS. 2 and 3A show the insertion, into a female contact array, of FPC 30 which has been attached to spring member 40. As shown in FIG. 2, extension section 47 of spring member 40 is pushed by, for example, the operator's fingers to first section 43 of spring member 40 in a direction of an arrow A. FPC 30 is thus inserted into space between fixed sections 21 and contact sections 22 of female contacts 20 in the direction of an arrow B, with no frictional resistance produced between FPC 30 and the female contacts. Then, the compressive force acting in the direction of the arrow A is released, and FPC 30 is pressed against the inner surface of contact sections of female contacts 20 by the force of spring member 40 while female contacts firmly hold spring member 40 via FPC 30 under its recovery force. As a result, each of exposed-conductor 33a of FPC lying between contact section 22 and spring member 40 firmly contacts female contact 20, electrically connecting FPC to the female contact array. Since the female contact and FPC both have spring elasticity, they can achieve a very reliable, firm electrical connection.

Projection 14 is formed along the marginal edge of second side wall 16, so that spring member 40 engages the projection at its step.

Figure 3B:
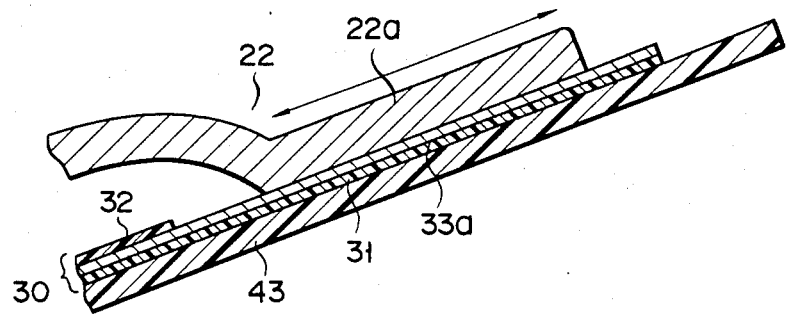
FIG. 3B is an enlarged view showing a contact portion of the connector of FIG. 3A.

In this embodiment, as shown in FIG. 3B, contact section 22 of female contact 20 has contact area 22a upwardly inclined at angle, nearly equal to that of slope of second section 43 of spring member 40, ensuring a positive, reliable and firm electrical connection between contact section 22 and exposed-conductor portion 33a. As is also seen in FIG. 3B, conductors are covered with insulating sheet 32 at other than an area for contacting.

Figure 3C:
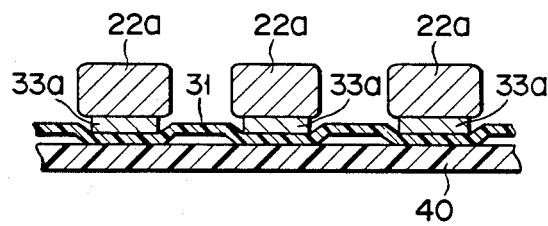
FIG. 3C is an enlarged cross-sectional view showing a portion of the connector as taken along line X—X in FIG. 3A.

FIG. 3C is a cross-sectional view showing a portion of the FPC connector as taken along X—X in FIG. 3A and shows a plurality of exposed-conductors 33a contacting the same number of female contacts 20.

FPC 30 can readily be detached from the array of female contacts 20 when it is pulled from opening 11 of housing 10, with first and second sections 42 and 43 of spring member 40 gripped by the operator's fingers.

In the FPC connector, two kinds of projections 44, 45 are formed at the side edges of spring member 40, as shown in FIG. 1, one for guide and the other for stopper. Guide sections 44 extend along both sides of first section 42 of said spring member. Grooves 12 are formed at the inenr walls of said housing to receive the guide sections. Stoppers 45 are formed one at each side of second section 43 of said spring member. Stopper receiving areas 13 are formed at the corners of second wall 16 of said housing. Stoppers 45 are latched to stopper receiving areas 13.

To insert spring member 40 into housing 10, guide sections 44 of spring member 40 are placed along guide grooves 12 so that exposed-conductor portions 33a can be inserted correctly into female contacts 20. After spring member 40 has been inserted into housing 10 as shown in FIG. 3A, it tends to bound out of female contact array due to the recovery force of the contacts, but is prevented from bounding by projections 14 and 13. The position and size of projections 13, 14 are preferably selected so that any further expansion of female contacts 20 by spring member is restricted. Female contacts 20 cannot expand more than required. This alleviates a burden of the spring of the female contact side.

Figure 4:
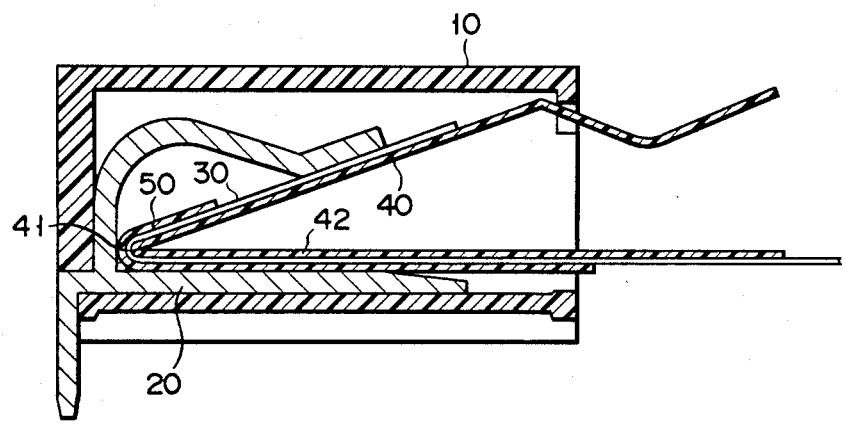
FIG. 4 is a cross-sectional view showing an FPC connector according to another embodiment of this invention.

In order to more reduce the wear of FPC 30 due to a friction during attachment and detachment of FPC to and from the female contacts 20 and to protect the forward portion of FPC 30 at that time, protective sheet 50 can be bonded to the forward portion, of the FPC including the portion on first section 42 and first line 41 of spring member as shown in FIG. 4. This sheet also permits a ready insertion of the into the contacts.

Figure 5:
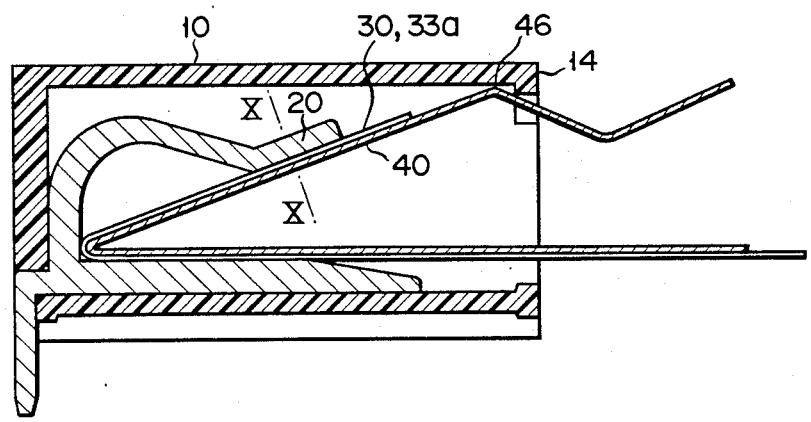
FIG. 5 is a cross-sectional view showing an FPC connector according to another embodiment of this invention.

FIG. 5 shows a connector of another embodiment of the invention. This connector is similar to the one shown in FIGS. 2 and 3A except for the material of the spring membr 40. In this connector the spring member 40 is formed of metallic sheet where the spring member in FIGS. 2 and 3A is formed of synthetic resin sheet.

Figure 6:
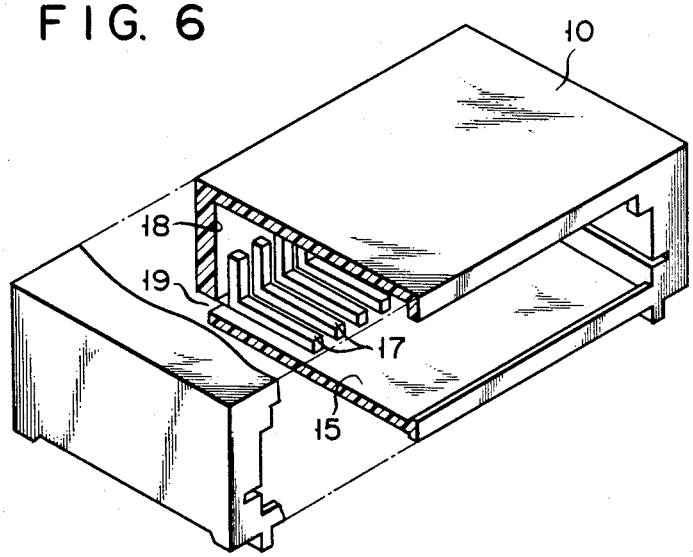
FIG. 6 is a perspective view of the housing of FIG. 1A.

FIG. 6 shows housing 10 without contacts. Housing 10 has projections 17 arranged at the surface of the first side wall 15. Projections 17 serve as spacers by which the female contacts 20 are isolated from each other with the projection therebetween. Projections 17 preferably extend along wall 18 vertical to first side wall 15 in order to prevent each contact section 22 from twisting.

Figure 7A:
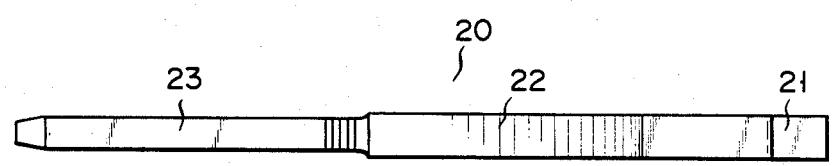
FIGS. 7A and 7B are a plan view and side view, respectively, of a female contact of FIG. 1A.
Figure 7B:
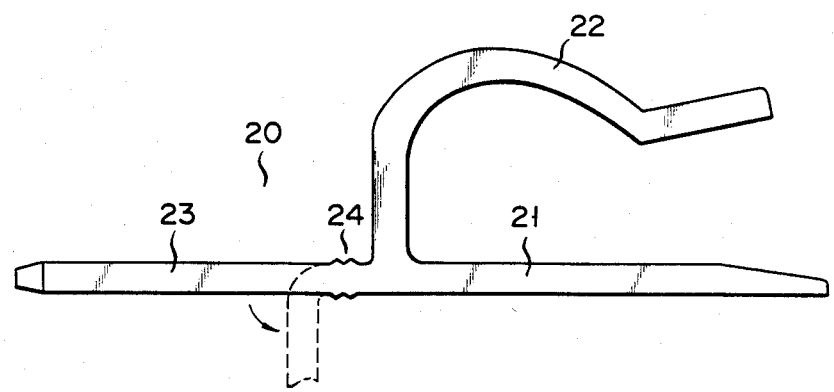

FIGS. 7A and 7B show female contact 20 to be attached to a housing. Female contact 20 has section 21, contact section 22 and connection pin 23. Contact section 22 and connection pin 23 are connected at their base ends to the base ends of section 21. Connection pin 23 is bent perpendicular to section 21 as indicated by the broken line (FIG. 7B) after it has been inserted into a housing through an hole 19 of the housing (see FIG. 6). The forward end of connection pin 23 is to be connected to a printed circuit board. Notches 24 is formed near to the base of conduction pin 23 so that any slippage of the female contact away from the housing may be prevented due to a friction between notches 24 and the surface of hole 19 of the housing.

What is claimed is:

1. An electrical connector for a flexible printed circuit comprising:
an insulating housing having an opening in an endwall, a first wall extending from a first side of the endwall and a second wall extending from an opposite second side of the endwall, said first and second walls facing each other, a plurality of resilient female contacts arranged parallel to one another in the housing and accessible through the opening in the endwall, each female contact having a fixed base section and a free contact section, said fixed base section extending rearward from the endwall and being secured to said first wall of the housing, said free contact section extending adjacent the second wall toward the opening in the endwall, said free contact section having at its end an upwardly inclined contact area, and a flexible printed circuit assembly comprising a V-shaped spring member formed of a thin sheet of material bent along a line to provide a first section and an upwardly inclined second section, a flexible printed circuit comprising a plurality of insulated conductors secured to an outside surface of said spring member, the conductors of said printed circuit being exposed at an area along said upwardly inclined second section, whereby the flexible printed circuit assembly can be inserted into the housing through the opening with the V-shaped spring member being resiliently engaged between the fixed base and free contact sections of the female contacts and whereby the upwardly inclined contact area at the end of the free contact section of each female contact makes a reliable and firm electrical contact with corresponding exposed conductors along said upwardly inclined second section of said spring member.

2. A connector according to claim 1, wherein the flexible printed circuit includes an insulating sheet bonded to the outer surface of the spring member and a parallel array of flat conductors disposed on the outer surface of the sheet, the conductors being spaced apart to correspond with the spacing between the female contacts.

3. A connector according to claim 2, wherein the flexible printed circuit further includes a second insulating sheet which covers the conductors except in the area where the conductors are exposed, the second insulating sheet extending over the first section of the V-shaped member.

4. A connector according to claim 1, further comprising a plurality of spacers arranged along the first wall of the housing for locating the base sections of the female contacts and isolating the contacts from one another.

5. A connector according to claim 4, wherein the spacers are in the form of ribs extending along the first wall of the housing in the same direction as the base sections of the female contacts, said spacers also having upstanding projections extending along a second endwall of the housing perpendicular to the first wall.

6. A connector according to claim 1, further comprising a first extension seciton extending from the second section of the spring member toward the first section of the spring member and a second extension section extending from the first extension section in a direction approximately parallel to the second section of the spring member.

7. A connector according to claim 1, further comprising a projection formed along the marginal edge of said second wall along a side of the opening in which said spring member is inserted, a first extension section extending from the second section of the spring member toward the first section of the spring member, and a second extension section extending from the first extension section in a direction approximately parallel to the second section of the spring member, providing a step between the second section of the spring member and the first extension section, whereby said spring member engages the projection at said step when the spring member is inserted into the housing.

8. A connector according to claim 1, wherein the second section of the spring member is provided at its side edges with latching means which engage with stops formed adjacent the opening of the housing to retain the flexible printed circuit assembly in the housing.

9. A connector according to claim 1, further comprising guide means formed at the side edges of the first section of the spring member, said guide means being engageable with rail means formed on opposite side walls of the housing at the sides of the opening to guide the flexible printed circuit assembly into the housing.

10. A connector according to claim 9, wherein the guide means comprise lateral projections of the first section of the spring member and the rail means comprise grooves formed in the inner surfaces of the opposite side walls of the housing.

11. A connector according to claim 1, further comprising a protective sheet mounted on the outer surface of said flexible printed circuit to extend at least partly over the first and second sections of the V-shaped member.

12. A connector according to claim 1, wherein the spring member is made from a synthetic resin sheet or a flexible metallic sheet.

13. A connector according to claim 1, wherein the female contact further comprise connection pin sections which extend through another opening in the housing.

* * * * *